US012666686B2

(12) United States Patent
Chiu et al.

(10) Patent No.: US 12,666,686 B2
(45) Date of Patent: Jun. 23, 2026

(54) SEMICONDUCTOR STRUCTURE WITH FLUSH SHALLOW TRENCH ISOLATION AND GATE OXIDE AND METHOD OF MANUFACTURING THE SAME

(71) Applicant: UNITED MICROELECTRONICS CORP., Hsin-Chu City (TW)

(72) Inventors: Ta-Wei Chiu, Changhua County (TW); Ping-Hung Chiang, Tainan City (TW); Chia-Ling Wang, Tainan City (TW); Wei-Lun Huang, Tainan City (TW); Chia-Wen Lu, Tainan City (TW); Yueh-Chang Lin, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 393 days.

(21) Appl. No.: 18/210,638

(22) Filed: Jun. 15, 2023

(65) Prior Publication Data

US 2024/0395883 A1 Nov. 28, 2024

(30) Foreign Application Priority Data

May 24, 2023 (TW) ................................. 112119291

(51) Int. Cl.
| | |
|---|---|
| *H10D 64/27* | (2025.01) |
| *H10D 30/65* | (2025.01) |
| *H10D 62/10* | (2025.01) |
| *H10D 64/01* | (2025.01) |
| *H10P 50/00* | (2026.01) |

(52) U.S. Cl.
CPC ........... *H10D 64/516* (2025.01); *H10D 30/65* (2025.01); *H10D 62/116* (2025.01); *H10D 64/01* (2025.01); *H10P 50/691* (2026.01)

(58) Field of Classification Search
CPC .... H10D 64/516; H10D 30/65; H10D 62/116; H10D 64/01; H10D 30/603; H01L 21/308; H01L 21/76224; H01L 21/76232
See application file for complete search history.

(56) References Cited

U.S. PATENT DOCUMENTS

| | | | |
|---|---|---|---|
| 6,677,766 B2 | 1/2004 | Mehrad | |
| 7,800,107 B2 | 9/2010 | Hong | |
| 8,518,775 B2 | 8/2013 | Liu | |
| 8,563,394 B2 | 10/2013 | Li | |
| 9,577,069 B1 * | 2/2017 | Pu | H01L 21/28123 |
| 9,659,948 B2 | 5/2017 | Hsu | |
| 9,741,850 B1 * | 8/2017 | Hsiao | H10D 30/608 |
| 9,978,762 B2 | 5/2018 | Hsu | |

(Continued)

*Primary Examiner* — Bitew A Dinke
(74) *Attorney, Agent, or Firm* — Winston Hsu

(57) ABSTRACT

A method of manufacturing a semiconductor structure with flush shallow trench isolation and gate oxide, including performing a first etching process to remove a pad oxide layer at one side of a STI and recess the substrate, the first etching process also forms a recess portion not covered by the first etching process and a protruding portion covered by the first etching process on the STI, forming a gate oxide layer on the recessed substrate, performing a second etching process to remove the protruding portion and the pad oxide layer and a first oxide layer on a drain region, performing a third etching process to remove a part of the STI and a second oxide layer, so that a top plane of the STI is flush with the gate oxide layer.

8 Claims, 12 Drawing Sheets

(56) References Cited

U.S. PATENT DOCUMENTS

| | | | |
|---|---|---|---|
| 10,411,088 B2 | 9/2019 | Hsiung | |
| 11,145,733 B1 * | 10/2021 | Chen | H01L 21/3083 |
| 2002/0074614 A1 * | 6/2002 | Furuta | H10D 84/0144 |
| | | | 257/E21.654 |
| 2002/0123205 A1 * | 9/2002 | Iwamatsu | H10D 86/01 |
| | | | 257/E21.564 |
| 2014/0302662 A1 * | 10/2014 | Ma | H01L 21/32 |
| | | | 438/424 |
| 2016/0336417 A1 * | 11/2016 | Hsiao | H10D 84/0151 |
| 2018/0102408 A1 * | 4/2018 | Hsiung | H10D 84/038 |
| 2018/0114842 A1 * | 4/2018 | Hsiao | H10D 30/608 |
| 2020/0058789 A1 * | 2/2020 | Lee | H10D 30/658 |
| 2024/0047542 A1 * | 2/2024 | Chen | H10D 64/01 |
| 2024/0243004 A1 * | 7/2024 | Wang | H01L 21/76229 |
| 2024/0258373 A1 * | 8/2024 | Kung | H10D 30/0221 |

* cited by examiner

SEMICONDUCTOR STRUCTURE WITH FLUSH SHALLOW TRENCH ISOLATION AND GATE OXIDE AND METHOD OF MANUFACTURING THE SAME

BACKGROUND OF THE INVENTION

1. Field of the Invention

The present invention relates generally to a semiconductor process, and more specifically, to a method of manufacturing a semiconductor structure with flush shallow trench isolation and gate oxide.

2. Description of the Prior Art

With the progress of semiconductor process and technology, the critical dimension of semiconductor device becomes smaller, and the high-voltage complementary metal oxide semiconductor (HV CMOS) has requirement for more precise semiconductor process and technology. In the design of tiny linewidth and high integration, the disturbance between devices becomes more obvious, and shallow trench isolation (STI) for the isolation between devices and relevant process become more important accordingly. Furthermore, high-voltage (HV) device area is usually provided with thick gate oxide layer, so that the step height of HV device area would be higher than the step height of those device areas with lower operating voltage and causes process issue. Accordingly, it is essential in semiconductor process to control the step height of STI and neighboring active areas in the HV device area.

Currently, there are some common approaches in conventional skill to achieve the purpose of controlling step height and topography, for example through chemical mechanical planarization (CMP), etching process or cleaning process. RCA wet cleaning process one of these processes. However, although the RCA wet cleaning process may achieve the purpose of controlling step height, excess RCA cleaning may easily damage silicon based surface at boundary of STIs, causing on-current ($I_{on}$) mismatch issue in later electrical tests. In another aspect, insufficient RCA cleaning may lead to worse topography, so that gates formed on the STI and the gate oxide layer later may suffer disconnection risk or the thickness of gate oxide layer may be abnormal. Accordingly, processes relevant to these issues should be compromised between the step height control and electrical performance. On the basis of circumstance above, those of skilled in the art need to improve existing processes and approaches, in hope of achieving better result for the topography and electrical properties of device structures.

SUMMARY OF THE INVENTION

In the light of the aforementioned issues encountered in conventional approaches, the present invention hereby provides a novel semiconductor process, with feature of removing the gate oxide layer on the low-voltage device area through a photolithography process after a RCA wet cleaning to control the step heights and topography of shallow trench isolation and gate oxide layer on the high-voltage device area, to avoid excess RCA wet cleaning damaging Si-based surfaces at the boundary of shallow trench isolation, causing on-current ($I_{on}$) mismatch issue in later electrical tests, and at the same time maintaining good structural topography and step height.

One aspect of the present invention is to provide a method of manufacturing a semiconductor structure with flush shallow trench isolation and gate oxide, including steps: providing a substrate, and the substrate is provided with a shallow trench isolation protruding from the substrate and a pad oxide layer covering the substrate; forming a first photoresist on a drain region at one side of the shallow trench isolation, and the first photoresist covers a part of a top plane of the shallow trench isolation from the side; performing a first etching process using the first photoresist as a mask to remove the pad oxide layer at the other side of the shallow trench isolation and recess the substrate, and the first etching process also forms a recess portion not covered by the first photoresist and a protruding portion covered by the first photoresist on the shallow trench isolation; removing the first photoresist; forming a gate oxide layer on the recessed substrate, and the gate oxide layer abuts the shallow trench isolation; forming a second photoresist on the gate oxide layer, and the second photoresist covers nearly all of the shallow trench isolation except an edge portion of the protruding portion at the side; performing a second etching process using the second photoresist as a mask to remove the protruding portion and the pad oxide layer on the drain region; removing the second photoresist; forming a first oxide layer on the drain region; forming a third photoresist on the gate oxide layer, and the third photoresist covers only an edge portion of the shallow trench isolation at the other side, and the region of shallow trench isolation covered by the third photoresist doesn't overlap the region of shallow trench isolation covered by the first photoresist; and performing a third etching process using the third photoresist as a mask to remove a part of the shallow trench isolation and all of the first oxide layer, so that the top plane of shallow trench isolation is flush with the gate oxide layer.

Another aspect of the present invention is to provide a semiconductor structure with flush shallow trench isolation and gate oxide, including structures of: a substrate with a well, a source region at one side of the well and a drift region at the other side of the well; a shallow trench isolation in the drift region, and a protruding portion and a first bird's beak structure are provided at outer side of the shallow trench isolation, and the first bird's beak structure connects with the protruding portion; a gate oxide layer on the well and the source region and connecting with the shallow trench isolation, and top planes of the shallow trench isolation and the gate oxide layer are flush, and a second bird's beak structure is provided on the source region at outer side of the gate oxide layer; and a gate on the gate oxide layer and a part of the shallow trench isolation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
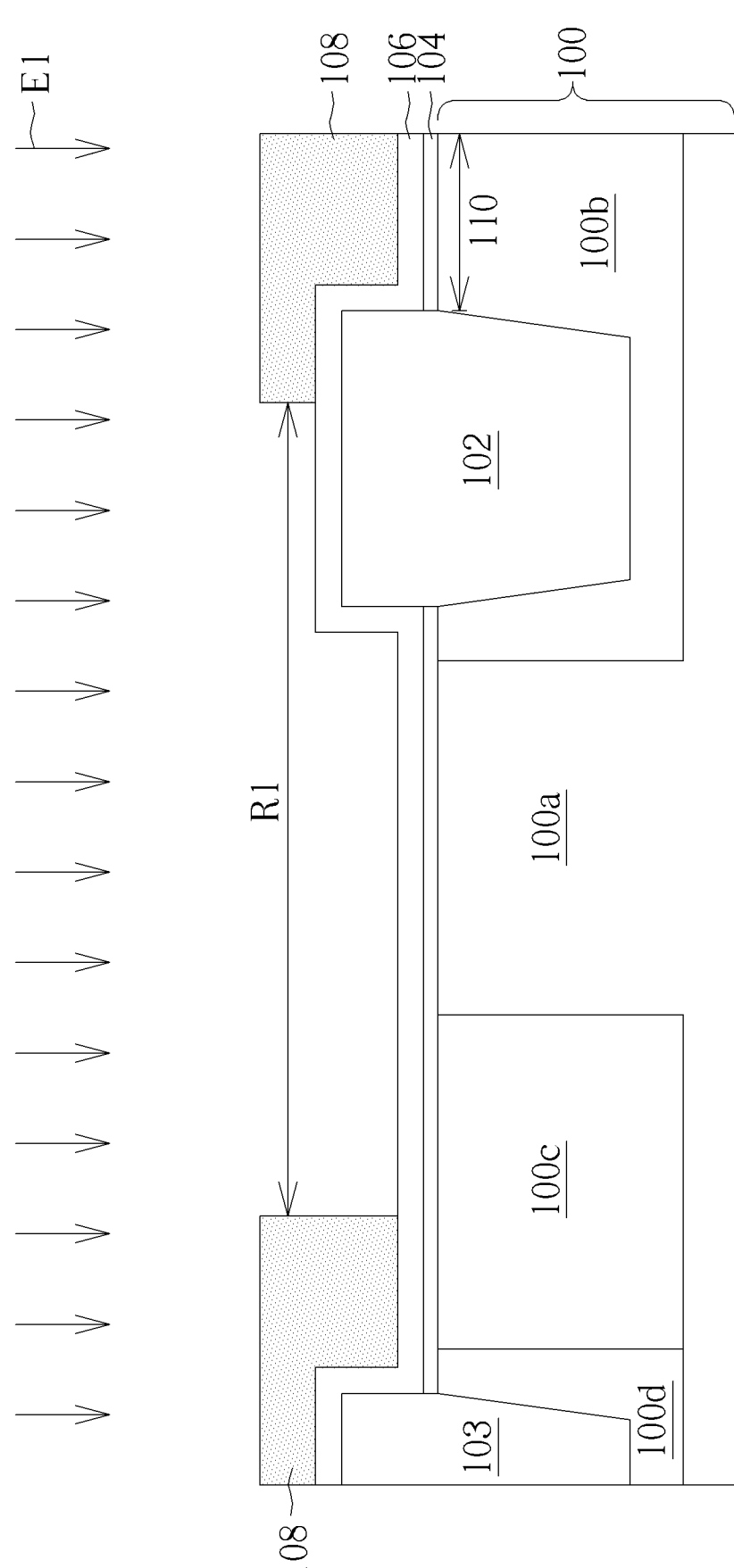
FIG. 1 to FIG. 11 are cross-sectional views illustrating a process flow of manufacturing a semiconductor structure with flush shallow trench isolation and gate oxide in accordance with the preferred embodiment of present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 10:
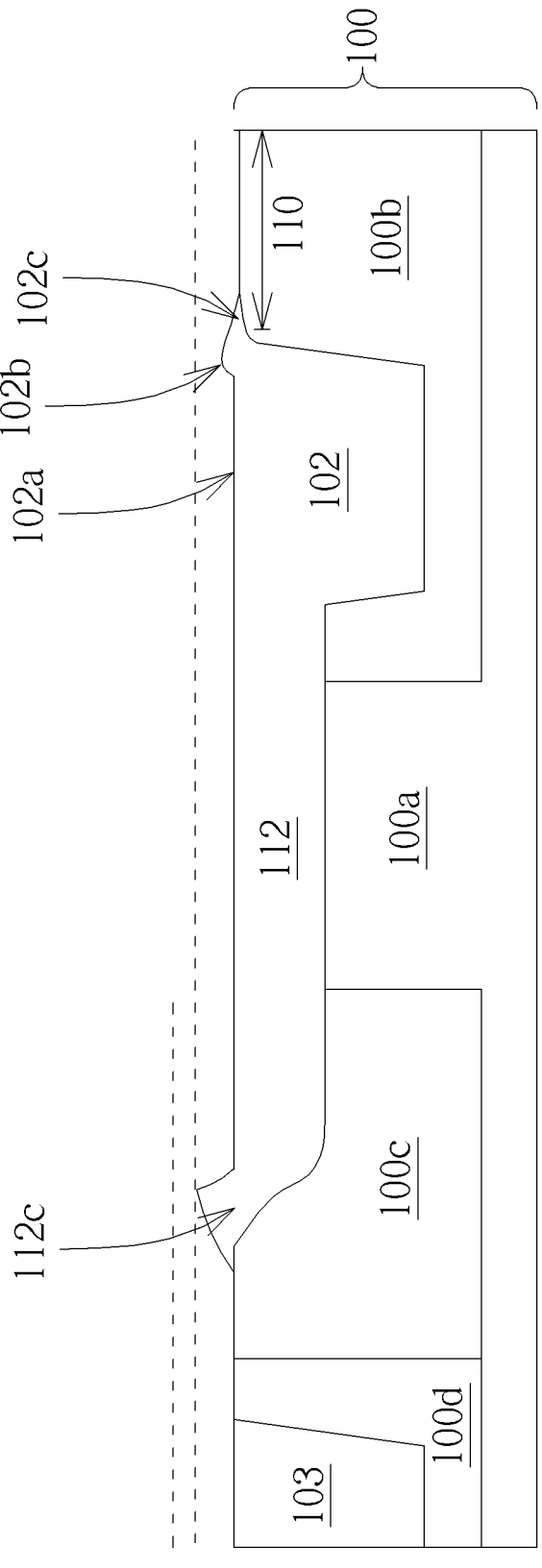
Figure 11:
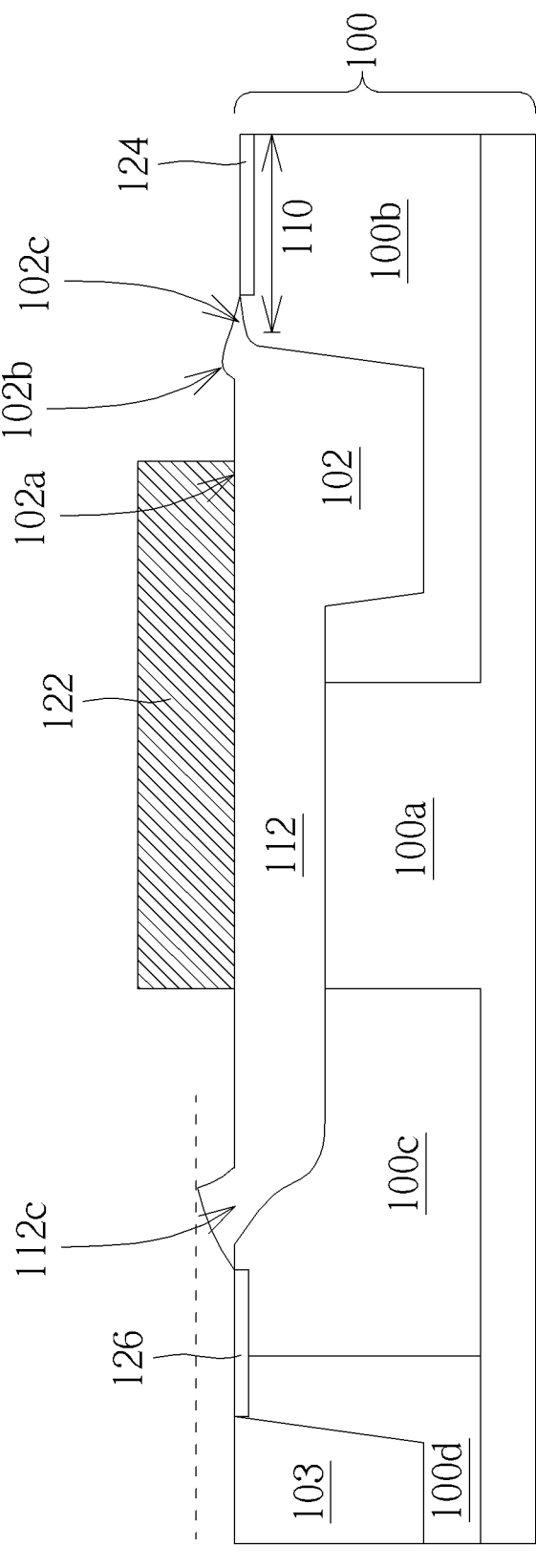
Figure 12:
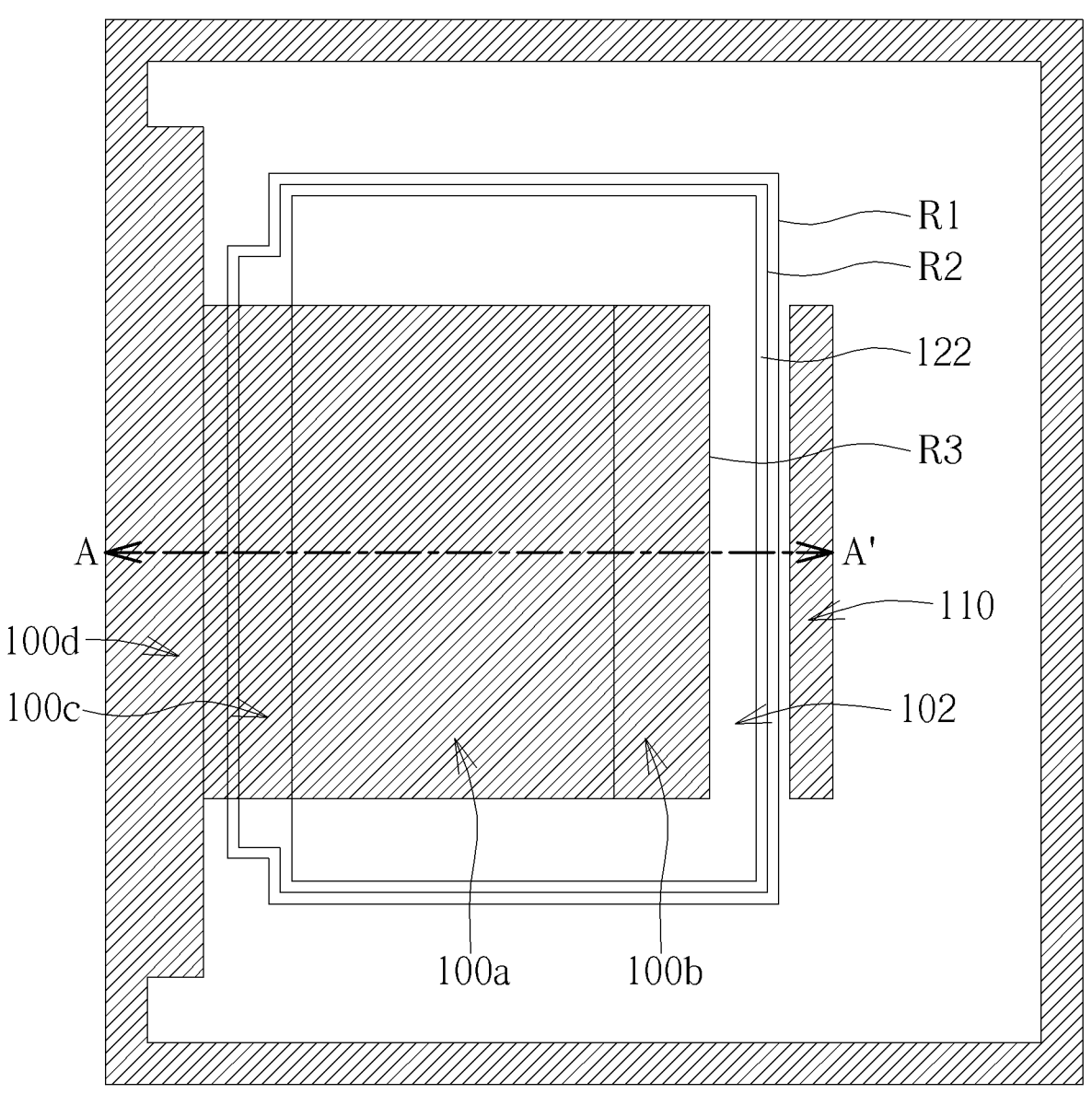
FIG. 12 is a schematic plane view of a semiconductor structure with flush shallow trench isolation and gate oxide in accordance with the preferred embodiment of the present invention.

Please refer now sequentially from FIG. 1 to FIG. 11, which illustrate a process flow of manufacturing a semiconductor structure with flush shallow trench isolation and gate oxide in the embodiment of present invention, wherein relative positions and connections between relevant components in the process in vertical direction are illustrated in the manner of cross-sections, and FIG. 12 may also be referred collectively to understand the encompassing and overlapping range of these features. The method of present invention is generally applied in the manufacture of high-voltage (HV) complementary metal oxide semiconductor (HV CMOS), and the cross-sections shown in the figures are also high-voltage area. However, the present invention may be applied, but not limited to, other semiconductor structures having requirement of step height and topography relevant to the structures of shallow trench isolation and gate oxide layer.

Please refer to FIG. 1. In the beginning of process, a semiconductor substrate 100 is provided as a basis for forming the semiconductor device of present invention. The material of substrate 100 is preferably a silicon substrate, ex. a p-type doped silicon substrate, but other Si-based substrate may also be adopted, including III-V compound semiconductor on silicon substrate (ex. GaN-on-silicon), silicon-on-insulator (SOI) or substrate with other doping types, but not limited thereto. The substrate 100 includes a well 100*a* encompassing entire area of semiconductor structure, ex. a p-type doped well (p-well). Through an ion implantation process, a body region 100*d*, a source region 100*c*, a p-well 100*a* and a drift region 100*b* are formed and abut each other sequentially on the substrate surface. The source region 100*c* and the drift region 100*b* are isolated by the p-well 100*a*, and the body region 100*d* abuts the source region 100*c*, wherein the drift region 100*b* may be a N-type doped well (n-well), the source region 100*c* may be a N-type heavily doped (N+) region, and the body region 100*d* may be a p-type heavily doped (P+) region. In the embodiment of present invention, two shallow trench isolations (STIs) 102, 103 are formed respectively in the drift region 100*b* and the body region 100*d* of substrate 100 and protrude from the substrate surface, with their material may be silicon oxide. In addition to the shallow trench isolations 102, 103, a pad oxide layer 104 is formed on the surface of substrate 100 surrounding the STIs 102, 103, and a conformal hard mask layer 106 is further formed on the surface of pad oxide layer 104 and STI 102. The material of pad oxide layer 104 and hard mask layer 106 may be silicon oxide and silicon nitride, respectively.

Please refer still to FIG. 1. After the structures above are prepared, a first photoresist 108 is then formed on the hard mask layer 106. In the embodiment of present invention, the first photoresist 108 exposes the region for forming a gate oxide layer in later process. As shown in FIG. 1, this region includes a part of the source region 100c, p-well 100a, a part of drift region 100b and a part of STI 102. The first photoresist 108 covers on the portion of drift region 100b that is predetermined to form a drain region 110 and on the portion of STI 102 abutting the drain region 110, and it also covers the STI 103, body region 100d and a part of the source region 100c abutting the body region 100d. The range exposed by the first photoresist 108 is shown as the range R1 in FIG. 12. In the embodiment of present invention, the first photoresist 108 defines the region to be formed with the gate oxide layer and the region where the step height of STI 102 to be lowered, in order to expose the substrate 100 there and reduce step height difference between the gate oxide layer formed later and the neighboring STI 102. After the first photoresist 108 is formed, a first etching process E1, such as an anisotropic dry etching process, is performed using the first photoresist 108 as a mask to etch the substrate 100 and the STI 102.

Figure 2:
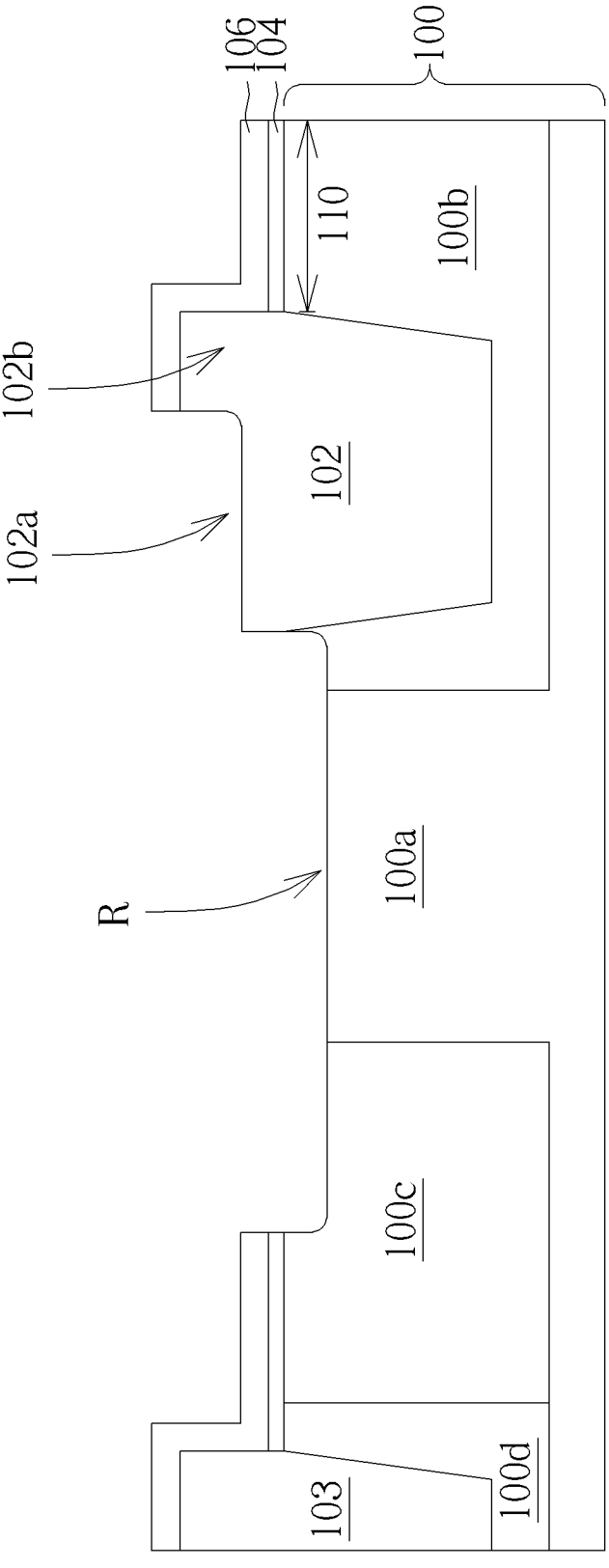

Please refer to FIG. 2. After the first etching process E1, as shown in the figure, the substrate 100 not covered by the first photoresist 108 is partially etched to form a recess R, which is roughly on the p-well 100a and the source region 100c and drift region 100b at two sides in the substrate 100, to serve as a space for forming a thick gate oxide required by high-voltage devices. The pad oxide layer 104 and hard mask layer 106 originally on the recess R are removed to expose Si-based substrate surface, for facilitating the silicon oxidation process later. Furthermore, the first etching process E1 also partially etches the portion of STI 102 not covered by the first photoresist 108 and form a recess portion 102a thereon, while a protruding portion 102b relative to the recess portion 102a is formed in the portion covered by the first photoresist 108 since it is not affected by the etching process. It can be seen that in this stage, the protruding portion 102b is at the side of STI 102 close to the predetermined drain region 110, which only occupy a small part of horizontal area of the STI 102, while the recess portion 102a is at the side of STI 102 close to the p-well 100a, which occupy most of the horizontal area of STI 102. In the embodiment of present invention, the formation of recess portion 102a may help to lower the step height of STI 102, so as to reduce its step height difference with the gate oxide layer to be formed later. Steps of the etching process above may specifically include removing the hard mask layer 106 not covered by the first photoresist 108, and then continuing the etching process using the patterned hard mask layer 106 to remove the pad oxide layer 104 below and the parts of substrate 100 and STI 102 to be removed, and removing the first photoresist 108 after the etching process.

Figure 3:
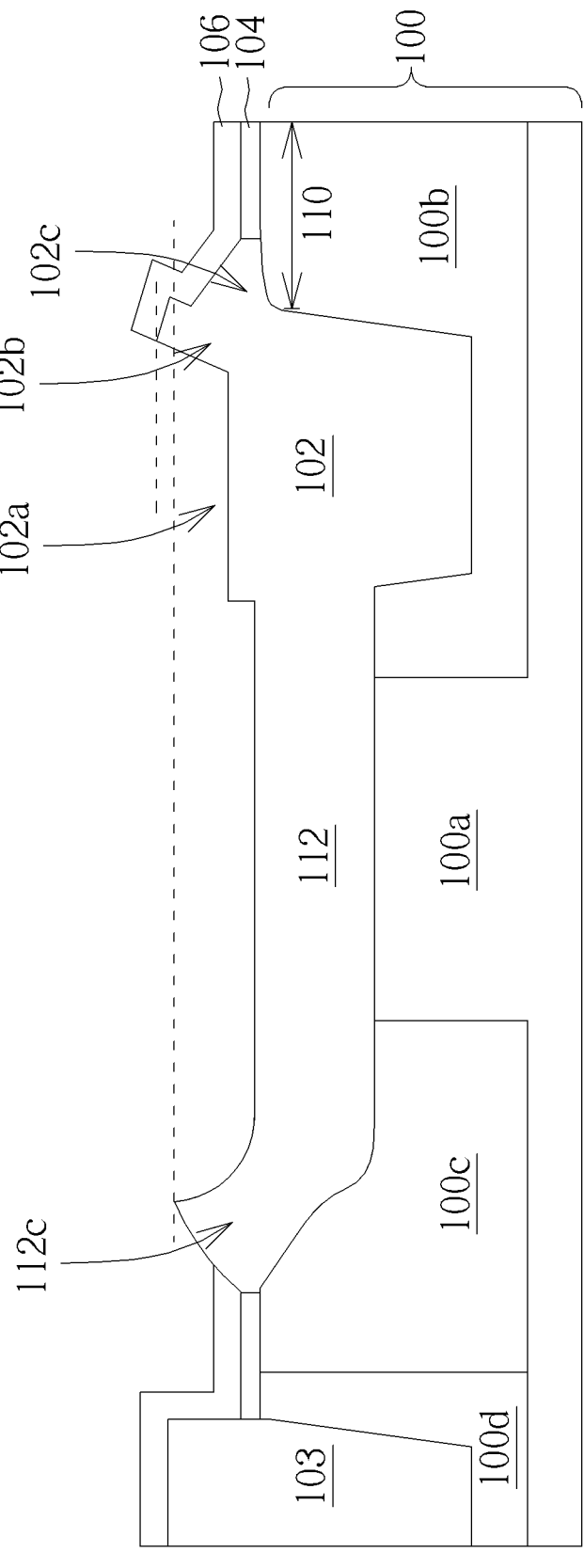

Please refer to FIG. 3. After the aforementioned recess R and recess portion 102a are formed, a RCA wet cleaning process (or referred as standard clean process) is performed first to clean the process surface, with substantially two steps of standard clean process SC-1 and SC-2 using cleaning solutions consisting respectively of alkaline solution like ammonia and acid solution like diluted hydrofluoric acid (DHF). In the embodiment of present invention, RCA cleaning process may include a pre-cleaning step to clean the area predetermined to form a sacrificial layer (not shown) and the gate oxide layer (i.e. recess R). In addition to removing particles on the surface of these areas, the RCA cleaning process may further lower the step height of STI 102. In certain conventional skills, this RCA cleaning process is an essential step of controlling the step height of STI, wherein excess RCA cleaning may easily damage Si-based surface at the boundary of STI 102 and cause the problem of on-current ($I_{on}$) mismatch in later electrical tests, while insufficient RCA cleaning may lead to insufficient step height reduction and worse topography, so that gates formed on the STI and the gate oxide layer later may suffer disconnection risk or the thickness of gate oxide layer may be abnormal. Accordingly, the present invention adopts less RCA cleaning treatment at this stage, for example with its process time less than standard RCA cleaning by 30 second, to avoid damaging the substrate surface, and the step height control of the STI 102 is achieved through later processes.

Refer still to FIG. 3. After the RCA cleaning process, a thermal oxidation process, ex. rapid thermal process (RTP), is then performed to oxidize the exposed Si-based substrate, so as to form a thick gate oxide layer 112 in the recess R, while other regions like predetermined drain region 110 and parts of neighboring source region 100c and body region 100d are unaffected since the blocking of pad oxide layer 104 and hard mask layer 106. With respect to high-voltage device, the resulted gate oxide layer 112 would abut the STI 102 on the drift region 100b and both of them may function collectively as a gate insulating layer for the high-voltage devices, while the portion surrounding and underlying the STI 102 may be considered as the drift region 100b of collector. Accordingly, the step height control between the neighboring gate oxide layer 112 and STI 102 is essential to the process of high-voltage device. At this stage, the step height of the recess portion 102a of STI 102 will be controlled at a level slightly higher than the step height of gate oxide layer 112. In the embodiment of present invention, this step height difference will be eliminated in later processes. Furthermore, in the embodiment of present invention, since the gate oxide layer 112 is formed through thermal oxidation process, the portion where the STI 102 and pad oxide layer 104 abut and the portion where the gate oxide layer 112 and pad oxide layer 104 abut may form bird's beak structures 102c, 112c respectively due to lateral diffusion of oxygen elements in the process. Furthermore, the protruding portion 102b once protruding vertically and upwardly on the STI 102 will tilt toward the bird's beak structure 102c due to the formation of adjacent bird's beak structure 102c, with its vertical height higher than the vertical height of bird's beak structure 112c.

Figure 4:
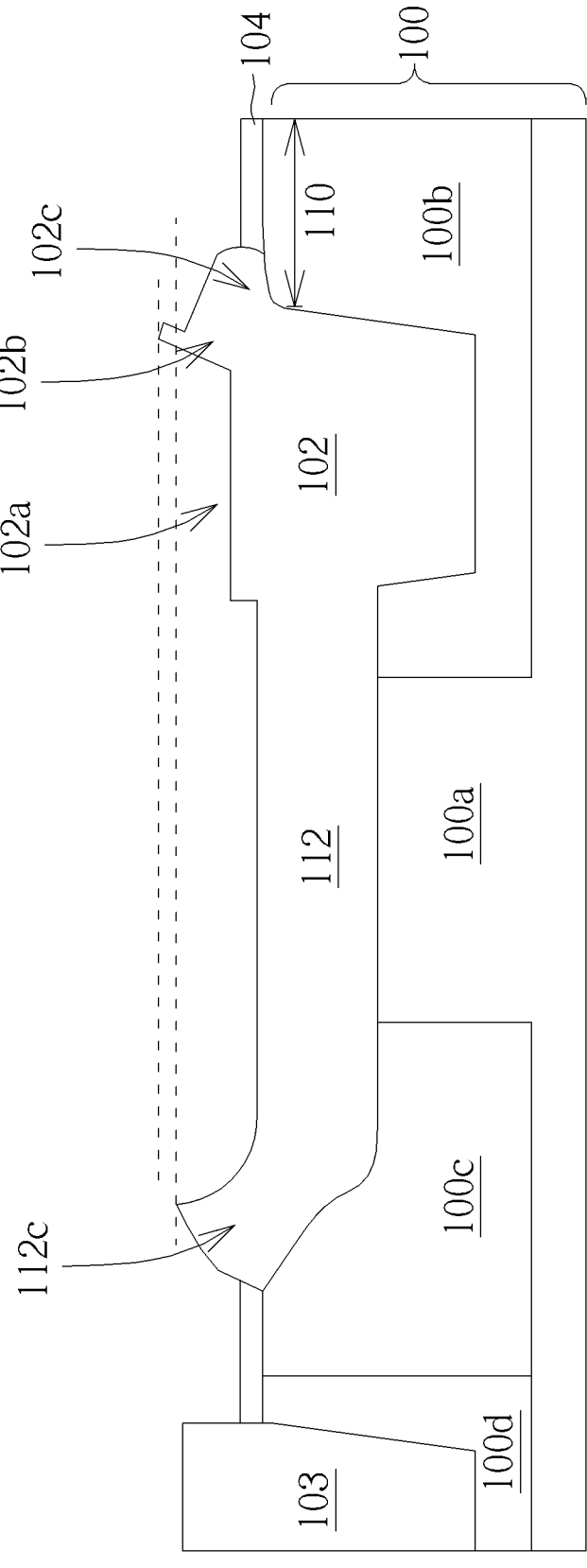

Please refer to FIG. 4. After the gate oxide layer 112 is formed, a selectively wet etching process is then performed to remove the hard mask layer 106 remaining on the substrate and expose the protruding portion 102b and pad oxide layer 104 below.

Figure 5:
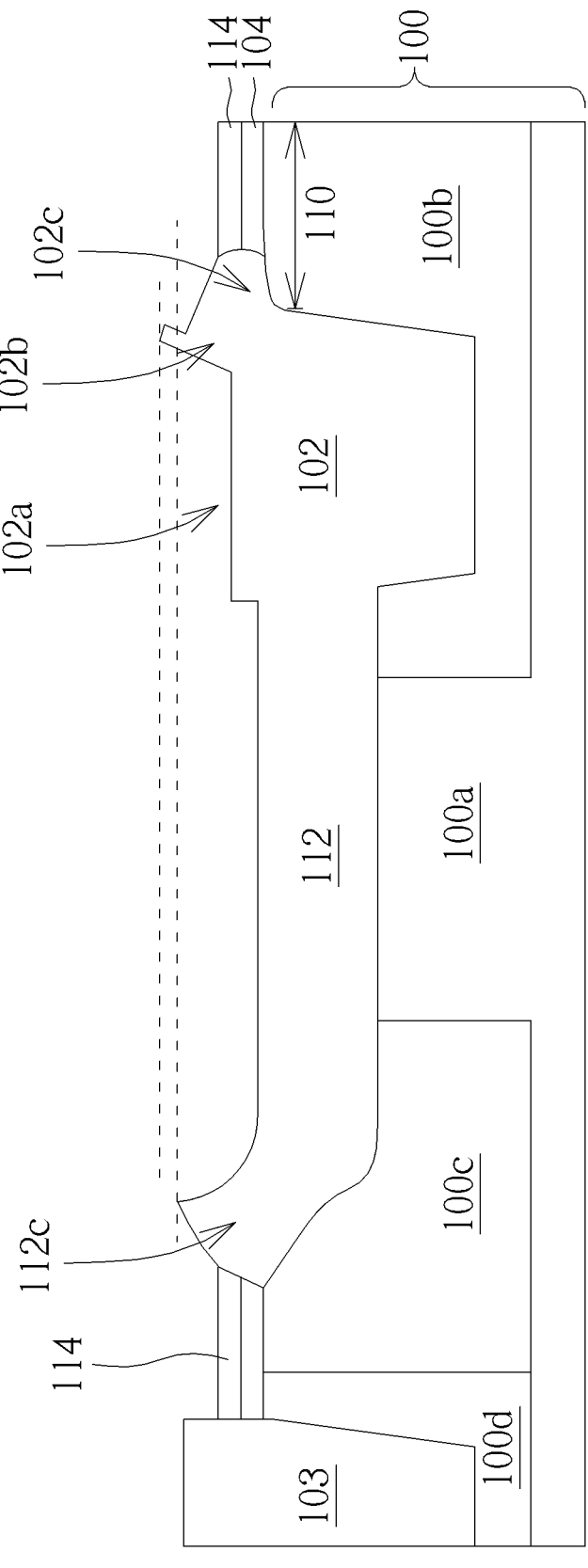

Please refer to FIG. 5. After the hard mask layer 106 is removed, a first oxide layer 114 is then formed on the pad oxide layer 104. This first oxide layer 114 may be a gate oxide layer formed on normal device area (not shown, with operating voltage about 2-4V, in comparison to the 10-15V of high-voltage device), with its thickness (ex. 210 Å) much thinner than the one of gate oxide layer 112 (ex. 1500 Å) formed previously for HV devices. The first oxide layer 114 may be formed through thermal oxidation too. As shown in the HV device region in the figure, the first oxide layer 114 can combine with underlying pad oxide layer to form a thicker oxide layer and abut the bird's beak structures 102c, 112c. Since the resulted gate oxide layer for HV device has very large thickness, its thickness is not affected and changed by the thermal oxidation process. Since the process on normal device area is not the key point of present invention, relevant figures and descriptions will be omitted herein in the specification.

Figure 6:
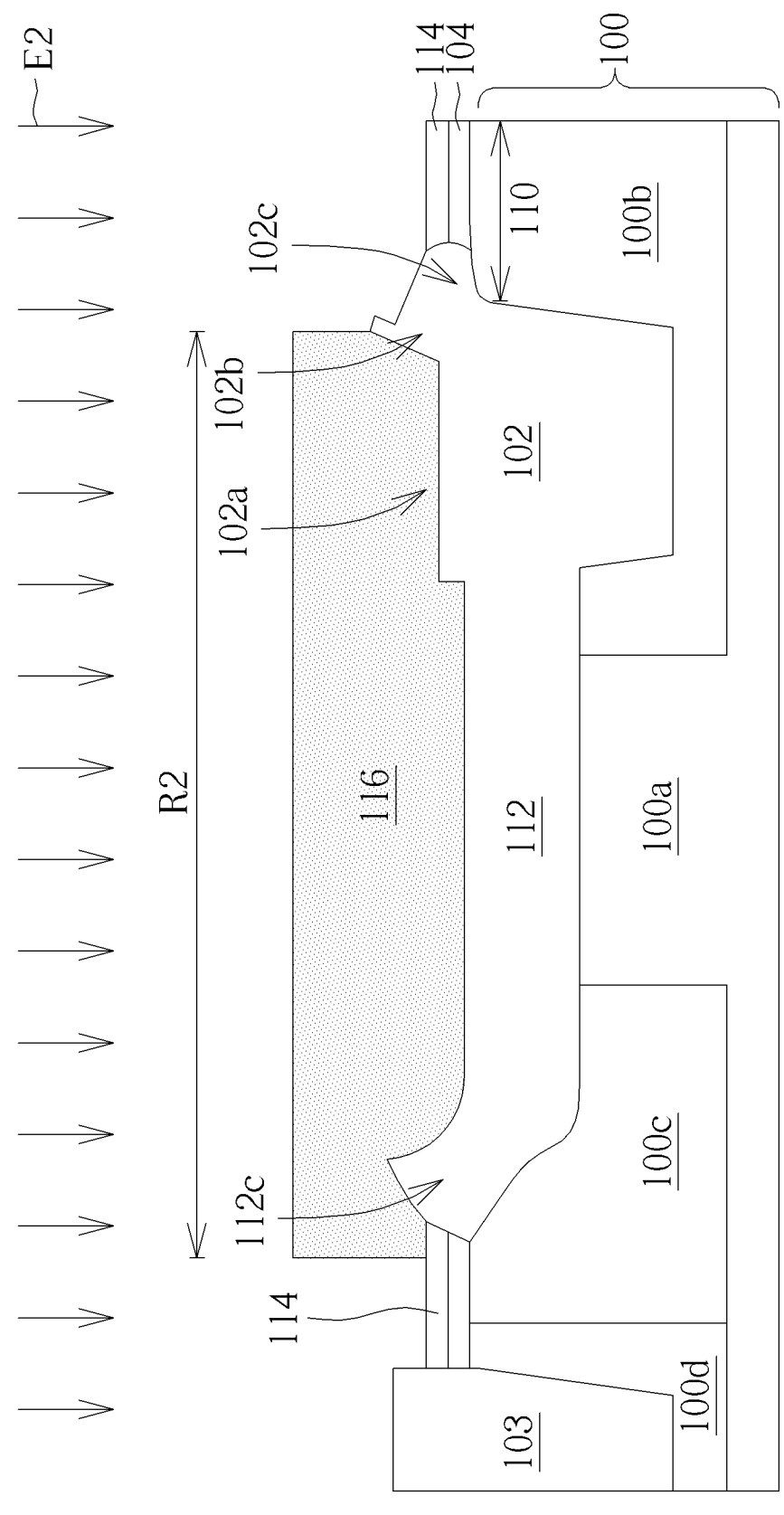

Please refer to FIG. 6. After the first oxide layer 114 is formed, a second photoresist 116 is then formed on the HV device area. In the embodiment of present invention, the second photoresist 116 covers the gate oxide layer 112, bird's beak structure 112c and most of the STI 102, and only a small part of the protruding portion 102b of STI 102 close to the drain region 110, the bird's beak structure 102c and the first oxide layer 114 are not covered by the second photoresist 116. The coverage of second photoresist 116 is shown as the range R2 in FIG. 12. In the embodiment of present invention, the second photoresist 116 defines a region of unnecessary first oxide layer 114 and a region where the step height of protruding portion 102b of STI 102 to be lowered. After the second photoresist 116 is formed, a second etching process E2, ex. a wet etching process, is then performed using the second photoresist 116 as a mask to etch the exposed protruding portion 102b and the first oxide layer 114. This wet etching process may use buffered oxide etch (BOE, NH₄F:HF=6:1) or DHF etchant, which has better etch selectivity to silicon oxide.

Figure 7:
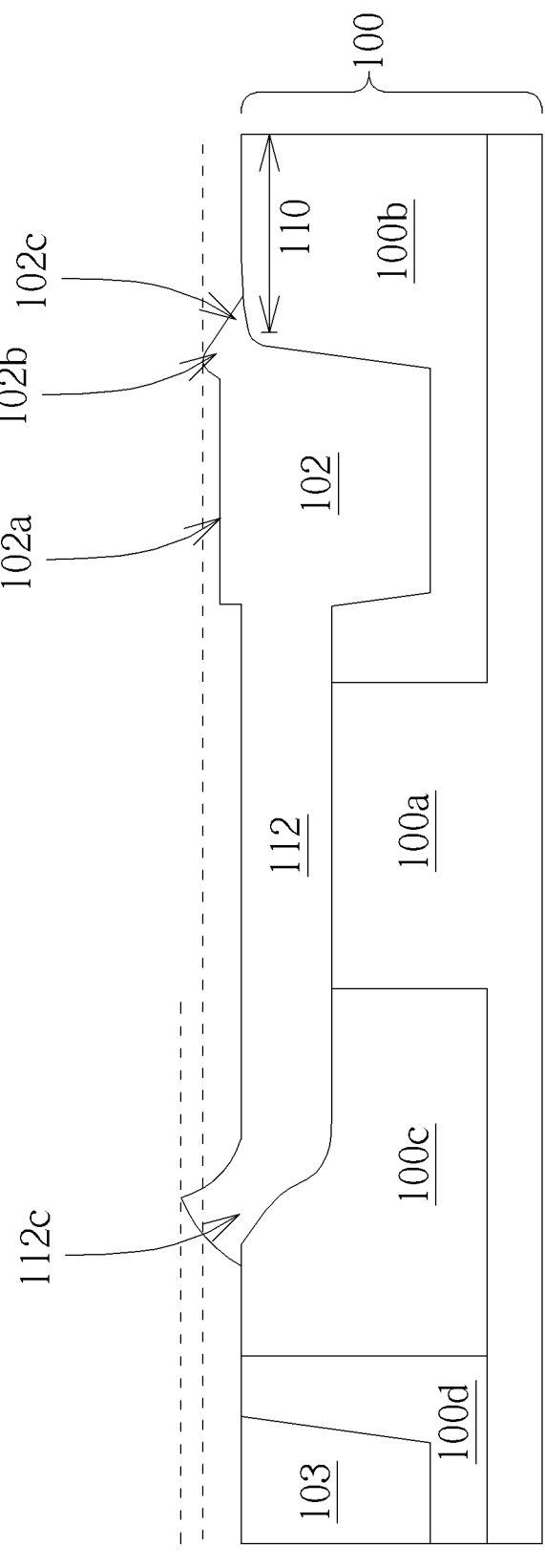

Please refer to FIG. 7. After the second etching process E2, as shown in the figure, the first oxide layer 114 and pad oxide layer 104 on the HV device area are removed to expose underlying predetermined drain region 110. Furthermore, a part of the protruding portion 102b of STI 102 is also removed in this step to lower its step height than the one of bird's beak structure 112c. The second photoresist 116 will be removed after the second etching process E2. In the embodiment of present invention, the first etching process E1 lowers the step height of STI 102 at the side close to the p-well 100a, while the second etching process E2 lowers the step height at the side of protruding portion 102b of STI 102. Both of them play a roll to control the step height.

Figure 8:
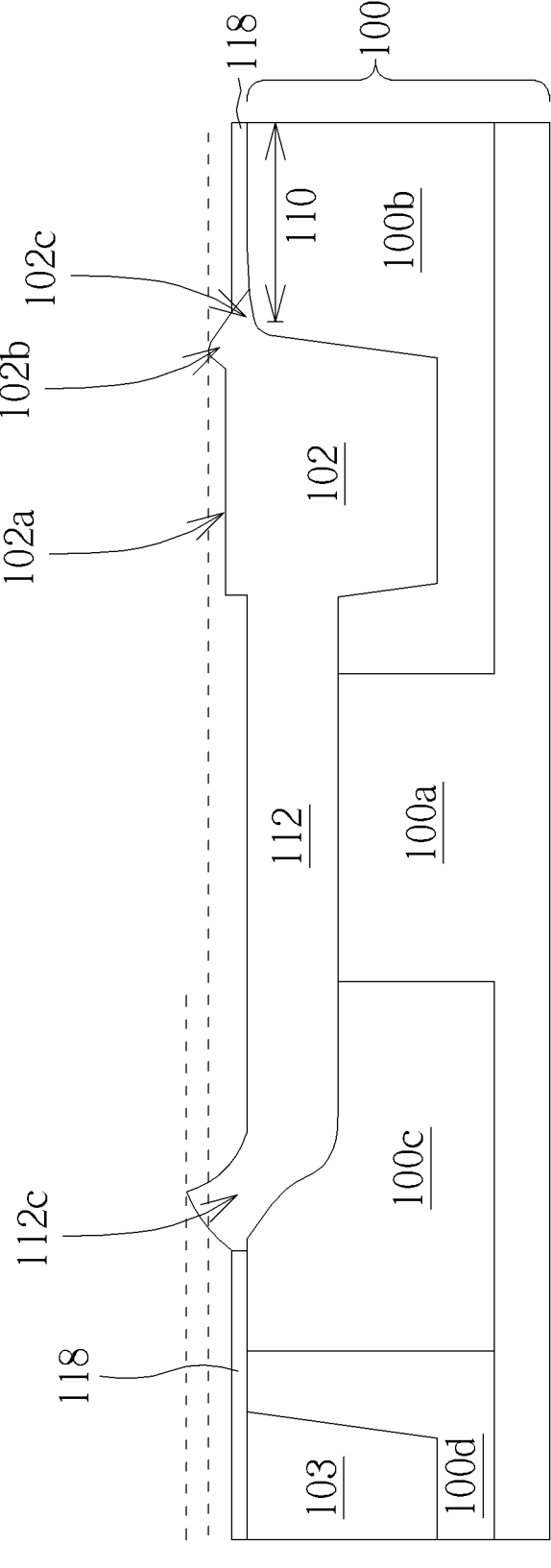

Please refer to FIG. 8. After the second etching process E2, a second oxide layer 118 is then formed on the exposed drain region 110 and a part of neighboring source region 100c and body region 100d. This second oxide layer 118 may be a gate oxide layer on a low-voltage (LV) device area (not shown, with its operating voltage about 1.2V, in comparison to the 2-4V of normal device and 10-15V of HV device), and with its thickness (ex. 15A) much thinner than the one of gate oxide layer 112 (ex. 1500A) formed previously for HV devices and the one of first oxide layer 114 (ex. 210A) for normal devices. The second oxide layer 118 will abut the bird's beak structures 102c, 112c. Similarly, since processes on normal device area is not the key point of present invention, relevant figures and descriptions will be omitted herein in the specification.

Figure 9:
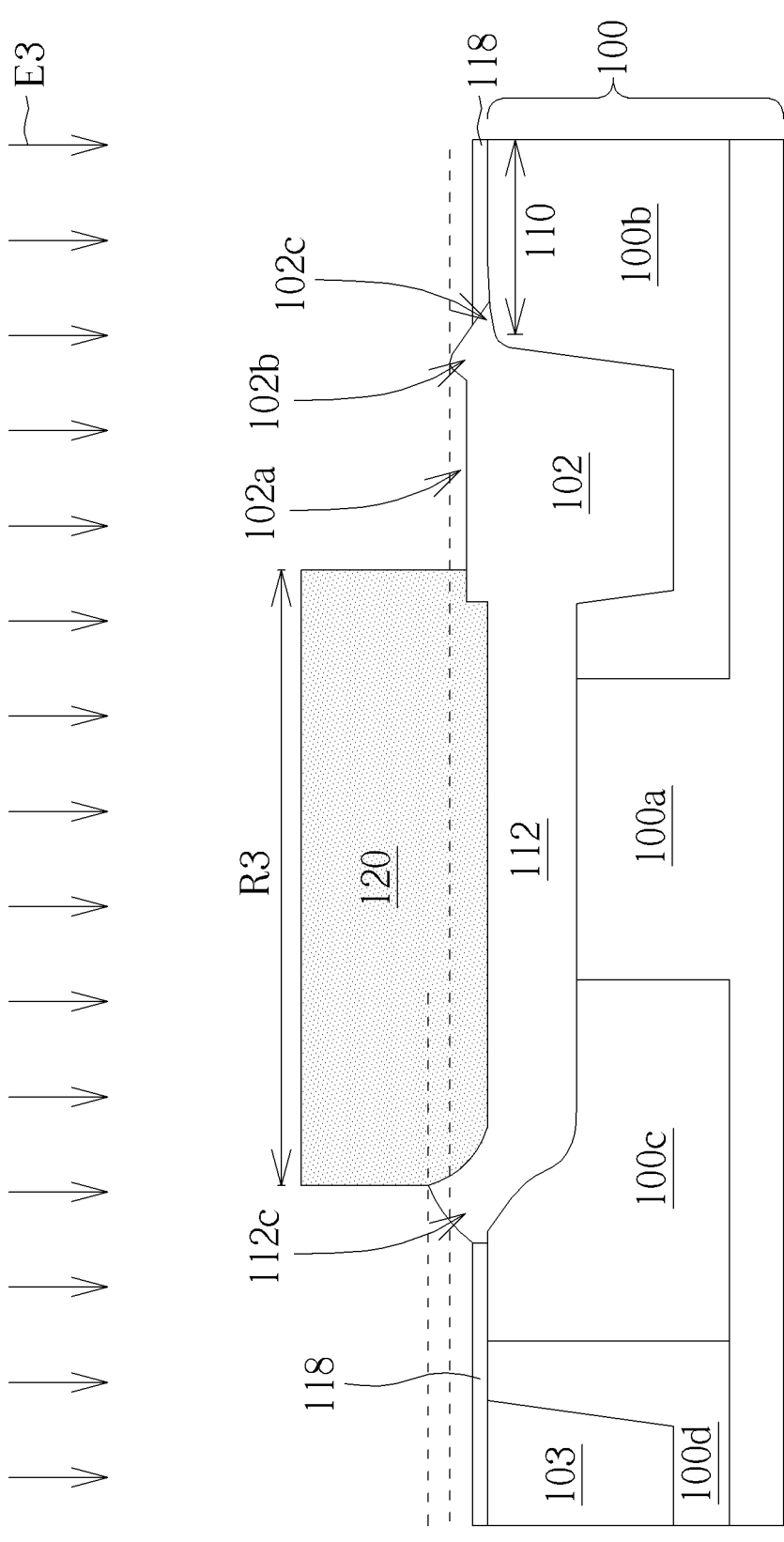

Please refer to FIG. 9. After the second oxide layer 118 is formed, a third photoresist 120 is then formed on the HV device area. In the embodiment of present invention, the third photoresist 120 covers on the gate oxide layer 112 and a small part of the STI 102 close to the gate oxide layer 112 and a part of the bird's beak structure 112c. Nearly most of the STI 102 is not covered by the third photoresist 120. The region of STI 102 covered by the third photoresist 120 doesn't overlap the region of STI 102 covered by previous first photoresist 108. The coverage of third photoresist 120 is shown as the range R3 in FIG. 12. In the embodiment of present invention, the second photoresist 116 defines the region of unnecessary second oxide layer 118. More importantly, it defines the region where the step height of STI 102 to be lowered, so that the STI 102 may be flush with the abutting gate oxide layer 112 after. Similar to the second etching process E2, after the third photoresist 120 is formed, a third etching process E3, ex. a wet etching process, is then performed using the third photoresist 120 as a mask to etch the exposed STI 102 and the second oxide layer 118. This wet etching process may use BOE or DHF etchant, which has better etch selectivity to silicon oxide.

Please refer to FIG. 10. After the third etching process E3, as shown in the figure, the second oxide layer 118 on the HV device area is removed to expose underlying drain region 10 and neighboring source region 100c and body region 100d. Furthermore, a part of the STI 102 is also removed to lower its step height to a level flush with the neighboring gate oxide layer 112, and the third photoresist 120 will be removed after the third etching process E3. Please note that, although a part of the STI 102 is covered by the photoresist in the third etching process E3, the covered part of STI 102 will also be removed to a level flush with surrounding portions due to isotropic etching property of the wet etching process. Furthermore, the third etching process E3 will also lower the step heights of bird's beak structure 112c and protruding portion 102b, but the step heights of lowered bird's beak structure 112c would still be higher than the step height of protruding portion 102b.

In comparison to the approach of conventional skill that controls the step heights of STI 102 and gate oxide layer 112 through RCA cleaning process with longer time and first etching process, in the embodiment of present invention, the step heights of neighboring STI 102 and gate oxide layer 112 is achieved eventually through the third etching process E3, so that the cleaning time of RCA process before may be reduced to avoid damaging Si-based surface and impacting electrical properties, as well as maintaining the topography required by device structures at the same time, which is the advantage of the present invention.

Please refer to FIG. 11. After the third etching process E3, a gate 122 is then formed on the HV device area, with material like polysilicon. In the embodiment of present invention, the gate 122 is on the flush plane of parts of the gate oxide layer 112 and STI 102, while the bird's beak structure 112c and protruding portion 102b are at two sides of the gate 122 respectively, and the gate oxide layer 112 and STI structure 102 function collectively as a gate insulating layer for the gate 122. The portion below gate 122 is a p-well 100a and drift region 100b for HV devices, and the gate 122 and drain region 110 are isolated through the STI 102. Preferably, one end of the gate 122 is aligned with the p-well 100a and source region 100c, and the other end of the gate 122 is aligned with the midline of STI 102. Since the aforementioned processes and treatments create a flat process surface on the gate oxide layer 112 and the STI 102, the gate 122 formed thereon would not encounter disconnection issue as those in conventional skills.

According to the process above, the present invention hereby also provides a semiconductor structure with flush shallow trench isolation and gate oxide. Please refer to FIG. 11, and the plane view of FIG. 12 may also be referred collectively. FIG. 11 is a cross-sectional view taken along the section line A-A' in FIG. 12. The semiconductor structure with flush shallow trench isolation and gate oxide of the present invention includes a substrate 100. In the preferred embodiment, the substrate 100 is provided with a well 100a, a source region 100c at one side of the well 100a and a drift region 100b at the other side of the well 100a. A body region 100d is further provided at the side of source region 100c opposite to the well 100a. A STI 102 is in the drift region 100*b*. A protruding portion 102*b* and a first bird's beak structure 102*c* are provided at outer side of the STI 102, and the first bird's beak structure 102*c* connects with the protruding portion 102*b*. A gate oxide layer 112 on the well 100*a* and source region 100*c* and connecting with the STI 102, and top planes of the STI 102 and gate oxide layer 112 are flush, and the flush top plane of STI 102 and gate oxide layer 112 is also in the same level as the top planes of source region 100*c* and drift region 100*b*. The drift region 100*b* at the other side of STI 102 opposite to the gate oxide layer 112 is a drain region 110. A second bird's beak structure 112*c* is provided on the source region 100*c* at outer side of the gate oxide layer 112, wherein the height of second bird's beak structure 112*c* is higher than the height of protruding portion 102*b*, and the heights of first bird's beak structure 102*c*, second bird's beak structure 112*c* and protruding portion 102*b* are higher than the flush top plane of STI 102 and gate oxide layer 112. A gate 122 is on the gate oxide layer 112 and a part of the shallow trench isolation 102, wherein one side of the gate 122 is aligned with the boundary of well 100*a* and source region 100*c*. In addition, a drain region 124 is further included and formed on the drain region 110 at outer side of the first bird's beak structure 102*c*, and a source 126 is formed on the source region 100*c* and body region 100*d* at outer side of the second bird's beak structure 112*c*.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor structure with flush shallow trench isolation and gate oxide, comprising:

providing a substrate, and said substrate is provided with a shallow trench isolation protruding from said substrate and a pad oxide layer covering said substrate;

forming a first photoresist on a drain region at one side of said shallow trench isolation, and said first photoresist covers a part of a top plane of said shallow trench isolation from said side;

performing a first etching process using said first photoresist as a mask to remove said pad oxide layer at the other side of said shallow trench isolation and to recess said substrate, and said first etching process also forms a recess portion not covered by said first photoresist and a protruding portion covered by said first photoresist on said shallow trench isolation;

removing said first photoresist;

forming a gate oxide layer on recessed said substrate, and said gate oxide layer abuts said shallow trench isolation;

forming a second photoresist on said gate oxide layer, and said second photoresist covers nearly all of said shallow trench isolation except an edge portion of said protruding portion at said side;

performing a second etching process using said second photoresist as a mask to remove said protruding portion and said pad oxide layer on said drain region;

removing said second photoresist;

forming a first oxide layer on said drain region;

forming a third photoresist on said gate oxide layer, and said third photoresist covers only another edge portion of said shallow trench isolation at said the other side, and a region of said shallow trench isolation covered by said third photoresist doesn't overlap a region of said shallow trench isolation covered by said first photoresist; and performing a third etching process using said third photoresist as a mask to remove a part of said shallow trench isolation and all of said first oxide layer, so that said top plane of said shallow trench isolation is flush with said gate oxide layer.

2. A method of manufacturing a semiconductor structure with flush shallow trench isolation and gate oxide of claim 1, further comprising forming a gate on a part of said gate oxide layer and said shallow trench isolation after said third etching process.

3. A method of manufacturing a semiconductor structure with flush shallow trench isolation and gate oxide of claim 1, further comprising a hard mask layer on said shallow trench isolation and said pad oxide layer, and said first etching process also remove said hard mask layer not covered by said first photoresist.

4. A method of manufacturing a semiconductor structure with flush shallow trench isolation and gate oxide of claim 3, further comprising removing said hard mask layer after said gate oxide layer is formed.

5. A method of manufacturing a semiconductor structure with flush shallow trench isolation and gate oxide of claim 1, further comprising performing a RCA cleaning process after said first photoresist is removed and before said gate oxide layer is formed, and said RCA cleaning process lowers said recess portion, but said recess portion is still higher than said gate oxide layer formed later.

6. A method of manufacturing a semiconductor structure with flush shallow trench isolation and gate oxide of claim 1, wherein said shallow trench isolation, said gate oxide layer and said pad oxide layer are in a high-voltage device area, and further comprising forming a second oxide layer on a normal device area after said gate oxide layer is formed, wherein said second oxide layer is formed on said pad oxide layer on said high-voltage device area, and said second etching process completely removes said pad oxide layer and said second oxide layer.

7. A method of manufacturing a semiconductor structure with flush shallow trench isolation and gate oxide of claim 1, wherein said shallow trench isolation, said gate oxide layer and said pad oxide layer are in a high-voltage device area, and said first oxide layer functions as a gate oxide layer on a low-voltage device area, and said third etching process removes said first oxide layer on said high-voltage device area.

8. A method of manufacturing a semiconductor structure with flush shallow trench isolation and gate oxide of claim 1, wherein said gate oxide layer is formed through a thermal oxidation process, and said thermal oxidation process also forms a bird's beak structure at said side of said shallow trench isolation, and said bird's beak structure is between and abuts said shallow trench isolation and said pad oxide layer.

* * * * *